(12) United States Patent
Doan (10) Patent No.: US 7,476,949 B2
(45) Date of Patent: Jan. 13, 2009

(54) LOW COMPRESSIVE TIN$_x$ MATERIALS AND METHODS OF MAKING THE SAME

(75) Inventor: Jonathan Doan, Mountain View, CA (US)

(73) Assignee: Texas Instruments Incorporated, Dallas, TX (US)

( * ) Notice: Subject to any disclaimer, the term of this patent is extended or adjusted under 35 U.S.C. 154(b) by 389 days.

(21) Appl. No.: 11/183,046

(22) Filed: Jul. 15, 2005

(65) Prior Publication Data

US 2007/0018261 A1    Jan. 25, 2007

(51) Int. Cl.
*H01L 29/82* (2006.01)

(52) U.S. Cl. .................................................. 257/415
(58) Field of Classification Search .......... 257/414–420
See application file for complete search history.

(56) References Cited

U.S. PATENT DOCUMENTS

2003/0217915 A1*   11/2003   Ouellet et al. ............... 257/414

* cited by examiner

*Primary Examiner*—Cuong Q Nguyen
(74) *Attorney, Agent, or Firm*—Wade James Brady, III; Frederick J. Telecky, Jr.

(57) ABSTRACT

Disclosed herein is a microelectromechanical device having a structural layer composed of a low stress TiN$_x$ layer and a method of making the same.

100 Claims, 5 Drawing Sheets

LOW COMPRESSIVE TiN$_x$ MATERIALS AND METHODS OF MAKING THE SAME

TECHNICAL FIELD OF THE INVENTION

The present invention is generally related to the art of TiN$_x$ materials, and more particularly, to microelectromechanical devices having low compressive TiN$_x$ layers and methods of making the same.

BACKGROUND OF THE INVENTION

TiN$_x$ is a ceramic that is electrically conductive. It is especially useful in devices having a member desired to be both mechanically and electrically superior. For example, the deformable or deflectable elements of microelectromechanical devices are desired to have reliable and robust performance, which suggest the use of stiff, strong ceramic materials with high melting temperatures. However, in many applications, it is necessary for the deformable or deflectable elements to perform multiple functions, some o which may require properties found only in materials that are mechanically inferior. For example, a deformable hinge and deflectable mirror plate of a micromirror device may be required to be electrically and or thermally conductive, which would necessitate utilization of a metallic material. Compared to ceramic materials, common electrically conductive materials that commensurate with the commercial fabrication facilities for microelectromechanical devices are generally inferior in mechanical properties including strength and creep resistance.

Therefore, what is needed is a TiN$_x$ material with low compression and a method of making the same.

SUMMARY OF THE INVENTION

In view of the foregoing, the present invention discloses a microelectromechanical device having a deformable and/or deflectable element composed of TiN$_x$ that is electrically conductive and mechanically superior to those common conductive materials for microelectromechanical devices. The TiN$_x$ layer in the microelectromechanical is preferably formed with a minimal stress to avoid unwanted curvature, or in other instances, buckling of the structural layers composed of the TiN$_x$ layer.

The TiN$_x$ film may comprise oxygen (e.g. with an amount between 0 and 15%). For example, the oxygen can be in the amount of from 0 to 15%, or 5% to 10%, or from 6% to 9%. The oxygen can be incorporated intentionally or unintentionally. The TiN$_x$ preferably has a stress that is greater than −800 MPa, such as −500 MPa or greater, −200 MPa or greater and −100 MPa or greater with a thickness of 500 angstroms or less, such as from 40 angstroms to 500 angstroms. Alternatively, the stress α of the deposited TiN$_x$ layer satisfies the expression of: $\alpha \geq [\alpha_o + M/(t+t_o)]$, wherein $\alpha_o$ is a constant that is 250 MPa or less. M is a constant that is $-1.6 \times 10^6$ Å or greater, such as $-9.43 \times 10^5$ Å or greater, $-6.6 \times 10^5$ Å or greater, $-2.83 \times 10^5$ Å or greater, and $-4.87 \times 10^4$ Å or greater. t is the thickness of the deposited TiN$_x$ layer. $t_o$ is a constant that is preferably 380 or less, such as 260 or less, 190 or less, 100 or less, and even 0 (zero). The stoichiometric ratio of titanium to nitrogen can be from 0.87 to 1.3, or from 0.94 to 1.28. Preferably the material is nitrogen rich such that the ratio of titanium to nitrogen is less than 1—e.g. from 0.99 to 0.87, more preferably from 0.98 to 0.92, depending upon the specific deposition recipe.

In one example of the invention, a TiN$_x$ layer is deposited and patterned to form a structural layer of a microelectromechanical device. The structural layer can be a layer of a deformable hinge, or a layer of a deflectable element (e.g. a mirror plate) of the microelectromechanical device. The TiN$_x$ layer is deposited using reactive sputtering with a low sputtering rate and low sputtering power, more preferably without RF (Radio Frequency) power. For example, the TiN$_x$ layer can be deposited with a DC magnetron sputtering, preferably in the absence of RF power. The deposition is preferably performed at a slow deposition rate, preferably 30 Å per second or less, such as 10 Å per second or less, 4 Å per second or less, and 2 Å per second or less. The ratio of the argon gas and nitrogen gas in the sputtering is preferably 2:1 or higher, such as 4:1 or higher, 5:1 or higher, 6:1 or higher, and 7:1 or higher. An exemplary recipe of reactive sputtering TiN$_x$ comprises: a sputtering temperature near 400° C., 700 watts sputtering power, 140 sccm flow rate of argon gas, and 20 sccm flow rate of nitrogen gas. The unit of "sccm" represents the "standard cubic centimeters per minute." Another exemplary sputtering recipe comprises: a sputtering temperature near 400° C., 1000 watts sputtering power, 140 sccm of flow rate for argon gas, and 25 sccm flow rate for nitrogen gas. When oxygen is desired in the TiN$_x$ film, oxygen gas may be directed to flow through the sputtering chamber. Other chemical elements, such as inert gas (e.g. argon, nitrogen, and xenon) cam also be directed to flowing through the sputtering chamber in aid of the sputtering process.

The objects and advantages of the present invention will be obvious, and in part appear hereafter and are accomplished by the present invention. Such objects of the invention are achieved in the features of the independent claims attached hereto. Preferred embodiments are characterized in the dependent claims.

BRIEF DESCRIPTION OF THE DRAWINGS

The accompanying drawings are illustrative and are not to scale. In addition, some elements are omitted from the drawings to more clearly illustrate the embodiments. While the appended claims set forth the features of the present invention with particularity, the invention, together with its objects and advantages, may be best understood from the following detailed description taken in conjunction with the accompanying drawings, in which:

DETAILED DESCRIPTION OF THE DRAWINGS

The present invention discloses a low compressive $TiN_x$ layer. The $TiN_x$ material may comprise oxygen in the amount of from 0 to 15%, or 5% to 10%, or from 6% to 9%. The oxygen can be added intentionally or by accident. Such $TiN_x$ material can be a part of a deformable element that deforms in operation, and/or a part of a deflectable element that deflects in operation, and/or a part of a non-movable element of the microelectromechanical device. The $TiN_x$ layer may or may not be connected to an external voltage signal applied to operate the microelectromechanical device. In the following, the present invention will be discussed with reference to micromirror devices comprising a deformable hinge and a deflectable reflective mirror plate, one or both of which comprise a low compressive $TiN_x$ layer. It will be understood by those skilled in the art that the following discussion is for demonstration purposes only, and should not be interpreted as a limitation. Instead, any variations without departing from the spirit of the invention are applicable.

Figure 1:
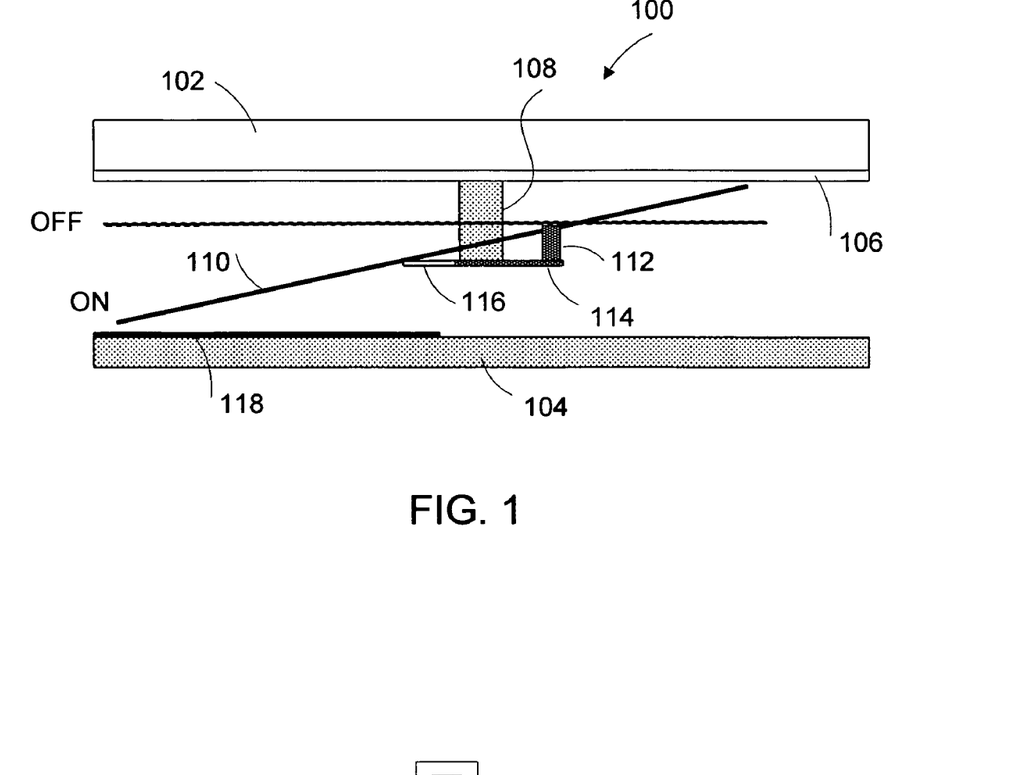
FIG. 1 is a cross-sectional view of an exemplary micromirror device having a deformable hinge and a deflectable mirror plate, in each of which embodiments of the invention can be implemented.

Turning to the drawings, FIG. 1 illustrates a cross-sectional view of an exemplary micromirror device in which embodiment of the invention can be implemented. Micromirror device 100 comprises reflective mirror plate 110 that is connected to deformable hinge 114 via hinge contact 112. The deformable hinge can be affixed to post 108 that is formed on light transmissive substrate 102, or connected to and held by post 108 through a hinge support. Addressing electrode 118 fabricated on semiconductor substrate 104 is disposed proximate to the mirror plate for electrostatically deflecting the mirror plate. Substrates 102 and 104 can be bonded together using suitable bonding agents, such as bonding agents comprising electrically conductive or insulating materials, which is not shown in the figure.

Figure 2:
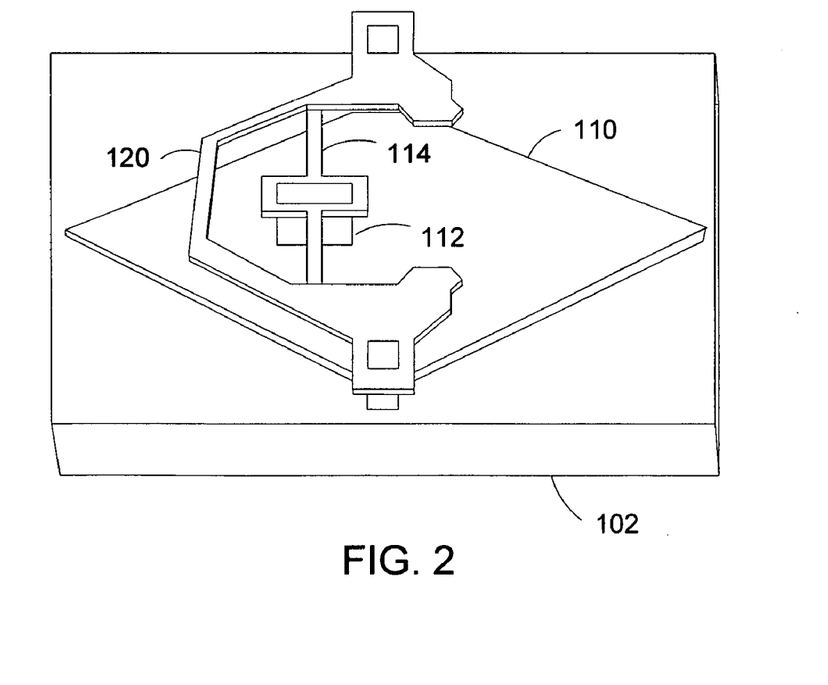
FIG. 2 is a perspective view of a micromirror having a cross-sectional view of FIG. 1.

As a way of example, FIG. 2 schematically illustrates an exemplary micromirror device having a cross-sectional view of FIG. 1. Referring to FIG. 2, mirror plate 110 is substantially square. The mirror plate is attached to deformable hinge 114 via hinge contact 112. The deformable hinge is affixed to hinge support 120; and the hinge support is held by posts formed on substrate 102.

The micromirror device as shown in FIG. 1 and FIG. 2 is operated electrostatically. Specifically, an electrostatic field is established between the mirror plate and addressing electrode (and/or electrode 106 is any). An electrostatic force derived from the electrostatic field yields an electrostatic torque to the mirror plate. With the electrostatic torque, the mirror plate rotates along a rotation axis. The rotation axis may or may not be coincident to a diagonal of the mirror plate depending on the specific configuration of the mirror plate and deformable hinge. This electrostatic actuation mechanism entails the mirror plate to be electrically conductive, or to comprise an electrically conductive layer through which external voltage signals can be applied. On the other hand, the mirror plate is required to be deflected during operation; and such deflection can be at a high frequency (e.g. 60 Hz or higher) over a long time period (e.g. thousands. or millions, or even billions of seconds). The mirror plate is thus expected to be both electrically conductive and mechanically robust.

According to an embodiment of the invention, electrical contact of the mirror plate is accomplished through the deformable hinge. Specifically, the deformable hinge comprises an electrically conductive layer that is electrically connected to the mirror plate, such as electrically connected to an electrically conductive layer of the mirror plate. The electrically conductive layer of the deformable hinge is connected to the external electrical voltage signals, either directly or indirectly through other elements (e.g. the posts) of the micromirror device. Meanwhile, the deformable hinge deforms when the mirror plate is electrostatically deflected. Therefore, it is desired that the deformable hinge is both electrically conductive (e.g. composed of an electrically conductive layer) and mechanically robust.

Because the deformable hinge and/or the deflectable mirror plate is desired to be both electrically conductive and mechanically robust, the deformable hinge and/or the mirror plate is desired to comprise a material that is electrically conductive and exhibits reliable mechanical properties, such as large mechanical strength and creep resistance. $TiN_x$ is such a candidate. $TiN_x$ is electrically conductive and has a mechanical strength and creep resistance higher than most of the common commercially available conductive materials currently used in microelectromechanical devices, such as aluminum, titanium, gold, silver, cupper, tungsten, nickel, and their alls. According to the invention, the deformable hinge and/or the deflectable mirror plate comprises a $TiN_x$ layer.

The $TiN_x$ can be fabricated using a reactive sputtering deposition technique. Specifically, the $TiN_x$ layer can be deposited on a structural layer of the micromirror device; or on a sacrificial layer during the fabrication of the micromirror device. By "structural layer" it is meant a layer of the micromirror device that remains after releasing the movable elements of the micromirror device by removing the sacrificial layers. Current $TiN_x$ films formed by reactive sputtering, however, are not suitable for micromirror devices due to their high stresses. For example, a 50 angstrom $TiN_x$ using current reactive sputtering generally has a stress that is more compressive than −800 MPa; and a 500 angstrom $TiN_x$ film is more compressive than −100 MPa. When the stress of the $TiN_x$ layer is too high at a certain thickness, the $TiN_x$ layer, as well as the structural layer composed of the $TiN_x$ layer may fracture.

Figure 3:
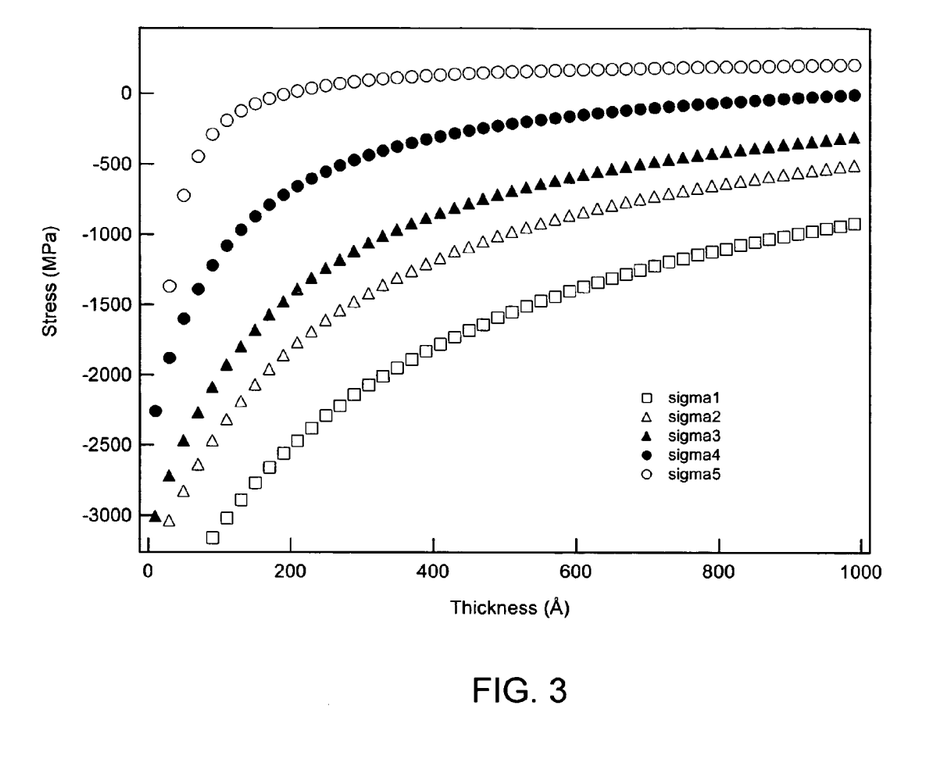
FIG. 3 schematically plots compression vs. thickness of TiN$_x$ layer.

In view of the foregoing, the present invention discloses a low compressive $TiN_x$ and a method of making the same. Turning to FIG. 3, FIG. 3 demonstratively illustrates the stress vs. the thickness of the $TiN_x$ layer. Open squares (sigma1) and open triangles (sigma2) are the stresses of $TiN_x$ layers deposited using sputtering recipes in the art. Solid triangles (sigma3), solid circles (sigma4) and open circles (sigma5) are stresses of the $TiN_x$ layers deposited using sputtering recipes of the present invention. It can be seen in the figure that the stresses of the $TiN_x$ layers of the invention is greater than those of the $TiN_x$ layer in the art. Specifically, for a given thickness, the $TiN_x$ layer of the invention has a greater stress (smaller absolute value) than that of the $TiN_x$ layer in the art. Also, to achieve the same stress, the $TiN_x$ layer of the present invention may have a smaller thickness than that of the $TiN_x$ in the art.

The curves of the stress vs. thickness for the $TiN_x$ materials of the invention can be expressed as:

$$\sigma = \sigma_o + \frac{M}{t - t_o}$$

wherein σ is the stress, $\sigma_o$ is a constant with a unit of MPa. M is a constant with a unit of MPaÅ. t is the thickness of the deposited $TiN_x$ material in a unit of Å; and $t_o$ is a constant in a unit of Å. Specifically, the $\sigma_o$, M, and $t_o$ for the curve of the solid triangles (sigma3) are 250 MPa, −6.6×10$^5$ MPaÅ, and 192.45 Å, respectively. The $\sigma_o$, M, and $t_o$ for the curve of the solid circles (sigma4) are 250 MPa, −2.83×10$^5$ MPaÅ, and 102.6 Å, respectively. The $\sigma_o$, M, and $t_o$ for the curve of the solid triangles (sigma3) are 250 MPa, $-4.87\times10^5$ MPaÅ, and 0 Å, respectively.

According to the invention, the $TiN_x$ of the present invention may comprise oxygen (e.g. greater than zero but preferably less than 15%). In fact, the oxygen in the $TiN_x$ material may come from the residual oxygen in the deposition chamber due to, for example, chamber leakage. Alternatively, oxygen can be added intentionally. In either instance, the $TiN_x$ material preferably has a stress that is greater than $-800$ MPa, such as $-500$ MPa or greater, $-200$ MPa or greater and $-100$ MPa or greater with a thickness of 500 angstroms or less, such as from 40 angstroms to 500 angstroms. Alternatively, the stress $\alpha$ of the deposited $TiN_x$ layer satisfies the expression of: $\alpha \geq [\alpha_o + M/(t+t_o)]$, wherein $\alpha_o$ is a constant that is 250 MPa or less. M is a constant that is $-1.6\times10^6$ MPaÅ or greater, such as $-9.43\times10^5$ MPaÅ or greater, $-6.6\times10^5$ MPaÅ or greater, $-2.83\times10^5$ MPaÅ or greater, and $-4.87\times10^4$ MPaÅ or greater. t is the thickness of the deposited $TiN_x$ layer. $t_o$ is a constant that is preferably 380 or less, such as 260 or less, 190 or less, 100 or less, and even 0 (zero). The stoichiometric ratio of titanium to nitrogen can be from 0.9 to 1.3, or from 0.94 to 1.28. Preferably the material is nitrogen rich such that the ratio of titanium to nitrogen is less than 1—e.g. from 0.99 to 0.87, more preferably from 0.98 to 0.92, depending upon the specific deposition recipe.

The $TiN_x$ layer of the micromirror device according to the invention can be fabricated in many ways. In one example of the invention, a $TiN_x$ layer is deposited and patterned to form a structural layer of a microelectromechanical device. The structural layer can be a layer of a deformable hinge, or a layer of a deflectable element (e.g. a mirror plate) of the microelectromechanical device. The $TiN_x$ layer is deposited using a reactive sputtering with a low sputtering rate and low sputtering power, more preferably without RF (Radio Frequency) power. For example, the $TiN_x$ layer can be deposited with a DC magnetron sputtering, preferably in the absence of RF power. The deposition is preferably performed at a slow deposition rate, preferably 30 Å per second or less, such as 10 Å per second or less, 4 Å per second or less, and 2 Å per second or less. The sputtering power is preferably 1200 watts or less, such as 1000 watts or less, 800 watts or less, and 700 watts or less. The ratio of the argon gas and nitrogen gas in the sputtering is preferably 2:1 or higher, such as 4:1 or higher, 5:1 or higher, 6:1 or higher, and 7:1 or higher. The deposition is preferably performed at a temperature of 500° C. degrees or lower, such as 450° C. or lower, 400° C. or lower, 350° C. or lower, and 300° C. or lower. The ratio of the argon gas and nitrogen gas in the sputtering is preferably higher than 4:1, such as 5:1 or higher, 6:1 or higher, or 7:1 or higher. An exemplary recipe of reactive sputtering $TiN_x$ comprises: a sputtering temperature near 400° C., 700 watts sputtering power, 140 sccm flow rate of argon gas, and 20 sccm flow rate of nitrogen gas. The unit of "sccm" represents the "standard cubic centimeters per minute." Another exemplary sputtering recipe comprises: a sputtering temperature near 400° C., 1000 watts sputtering power, 140 sccm of flow rate for argon gas, and 25 sccm flow rate for nitrogen gas. When oxygen is desired in the $TiN_x$ material, oxygen gas may be directed to flowing through the sputtering chamber. Other gases, such as nitrogen and inert gases can also be directed through the sputtering chamber.

Figure 4:
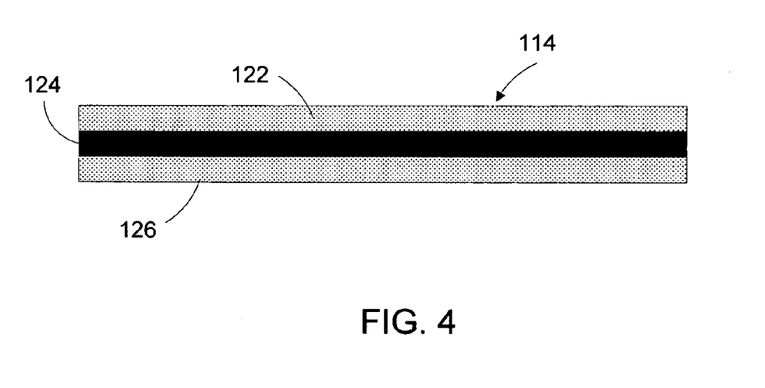
FIG. 4 schematically illustrates a cross-sectional view of a deformable hinge having a TiN$_x$ layer formed according to an embodiment of the invention.

In accordance with one example of the invention, the micromirror device comprises a deformable hinge that comprises a $TiN_x$ layer, as schematically illustrated in FIG. 4. Referring to FIG. 4, deformable hinge 114 (e.g. the deformable hinge 114 in the micromirror shown in FIG. 2) is a multilayered structure that comprises insulating layers 122 and 126, and conductive $TiN_x$ layer 124 laminated therebetween. The insulating layers may or may not be the same; and each may comprise $SiN_x$ or $SiO_x$ or other suitable materials, such as silicon carbide and polysilicon.

The thickness of the hinge layers can be adjusted depending upon the materials selected and the desired mechanical and electric properties of the deformable hinge, the stiffness of the movable element, the desired flexibility of the hinge, or other relevant factors. For example, for a $SiN_x$—$TiN_x$—$SiN_x$ hinge stack, the thickness of the deformable hinge is from 425 Å-2000 Å. The $SiN_x$ layers each may have a thickness from 200 Å to 800 Å. The $TiN_x$ layer is preferably from 20 Å to 200 Å, more preferably from 30 Å to 100 Å, and more preferably from 40 Å to 60 Å. The insulating layer of the deformable hinge can alternatively be $SiO_2$ with a thickness from 100 Å to 800 Å. The layer thicknesses can also be adjusted to affect the overall intrinsic stress of the hinge. For example, if each of the outside layers 122 and 126 in FIG. 4 exhibits an intrinsic stress of +150 MPa (tensile) and intermediate layer 124 exhibits an intrinsic stress of $-100$ MPa (compressive), the thickness of the intermediate layer can be increased to ensure that the average intrinsic stress is tensile. If the intermediate layer thickness is increased to three times that of the outside layers, the average intrinsic stress is given by $[(-100)*2+(150)*3]/(2+3)$, or +50 MPa (tensile).

The multilayered hinge as shown in FIG. 4 comprises three layers. It will be appreciated by those of ordinary skill in the art that the number of layers of the multilayered hinge in FIG. 4 should not be interpreted as a limitation. Instead, any number of layers can be employed without depart from the spirit of the present invention. In an alternative example, the deformable hinge may comprise a $TiN_x$ conductive layer. The deformable hinge may also be composed of a $TiN_x$ conductive layer and an insulating layer that comprises an insulating material, such as $SiN_x$ and $SiO_x$. In yet another example, the deformable hinge may comprise a $TiN_x$ conductive layer, one or more insulating and/or conductive layers with the $TiN_x$ and the insulating/conductive layers arranged in any suitable orders along the vertical direction. For example, the layers of the deformable hinge may be arranged as a metal-insulating, or insulating-metal, or metal-insulating-metal, or metal-insulating-insulating, or insulating-metal-insulating, or insulating-metal-metal, or insulating-insulating-metal, wherein at least one or more of the metallic layers comprise a $TiN_x$ layer of the invention.

In accordance with another embodiment of the invention, the deflectable reflective mirror plate may comprise a $TiN_x$ layer. For example, the mirror plate may comprise a reflective layer and a $TiN_x$ layer. The reflective layer preferably comprises a reflective material that is capable of reflecting 85% or more, or 90% or more, or 99% or more of the incident light. Examples of such materials are Al, Ti, Au, Ag, $AlSi_xCu_y$, $AlTi_x$, or $AlSi_x$. Of course, other suitable materials having high reflectivity to the incident light of interest may also be adopted for the mirror plate. The thickness of the mirror plate layer can be wide ranging depending upon many factors, such as desired mechanical (e.g. stiffness and strength) and electronic (e.g. conductivity) properties, the size, desired rotation angle of the mirror plate and the properties of the materials selected for the mirror plate. According to the invention, a thickness of the mirror plate is from 500 Å to 50,000 Å, preferably around 2500 Å. If the mirror plate layer comprises aluminum, it is preferred to be deposited at 150° C. to 300° C. or other temperatures preferably less than 400° C. The multiple functional layers of the mirror plate can be arranged in many suitable ways. It is preferred that, the top layer (the layer that is the closest to the incident light) of the mirror plate is the reflective layer for reflecting the incident layer, while the other layers are arranged in any desired order. As an example, the mirror plate (e.g. mirror plate 110) comprises a $TiN_x$ layer, a titanium layer, an aluminum layer, and a silicon dioxide layer. The $TiN_x$ layer preferably has a thickness from 100 Å to 2000 Å. The titanium layer is preferably from 10 Å to 200 Å. The aluminum layer is preferably from 1000 Å to 5000 Å, more preferably from 2500 Å to 3000 Å. The silicon oxide layer is preferably from 100 Å to 1000 Å, more preferably from 200 Å to 600 Å. Other structural layers may also be formed on the mirror plate. For example, the mirror plate may comprise an electrode (e.g. electrode 106 in FIG. 1) for electrostatically deflecting the mirror plate towards substrate 102. In this instance, electrode 106 is preferably transmissive to the incident light. For avoiding unwanted light scattering from the edges of the mirror plate, the mirror plate may comprise a light blocking material disposed around the circumference of the mirror plate, and/or on the vertical edges of the mirror plate, and any other portions that may produce light scattering.

The micromirror device as discussed above with reference to FIG. 1 and FIG. 2 may have other alternative features. Referring back to FIG. 1, stopper 116 can be provided to stop the rotation of the mirror plate when the mirror plate rotates to a particular angle, such as the ON state angle, can is preferably 10° degrees or more, or more preferably 12° degrees or more, or 14° degrees or more, or 16° degrees or more relative to substrate 102. The rotation can be symmetric or asymmetric depending upon the way the mirror plate being attached to the deformable hinge. Specifically, when hinge contact 112 connects to mirror plate 110 at a location offset from the mass center of the mirror plate, the mirror plate rotates asymmetrically relative to substrate 102—that is the maximum rotation angle (e.g. the ON state angle) achievable by the mirror plate in one direction is larger than that (e.g. the OFF state angle) in the other. Alternatively, the hinge contact can be connected to the mirror plate at a location that is substantially around the mass center of the mirror plate such that the mirror plate rotates symmetrically—that is the maximum achievable angles in both rotation directions are substantially the same.

In the above example, the mirror plate is connected to the deformable hinge with hinge contact 112 such that the mirror plate and deformable hinge are in separate planes when the mirror plate is parallel to substrate 102. In another embodiment, the mirror plate can be in the same plane as the deformable hinge, which is not shown in the figure. Specifically, the mirror plate can be derived from a single crystal, such as a single crystal silicon, as set froth in U.S. patent application Ser. Nos. 11/056,732 11/056,727, and Ser. No. 11/056,752 all filed Feb. 11, 2005, the subject matter of each being incorporated herein by reference.

The micromirror device may have other alternative features to improve the operation performance. For example, the addressing electrode can be positioned such that the addressing electrode extends beyond the furthest point of the mirror plate from the mass center of the mirror plate when the mirror plate is not deflected, as that set forth in U.S. patent application Ser. No. 10/947,005 filed Sep. 21, 2004, the subject matter being incorporated herein by reference. To avoid unwanted light scattering from the elements of the micromirror device, a light blocking/absorbing material can be provided, for example, on or around the addressing electrode, and/or the exposed areas of the deformable hinge, and/or any other exposed areas (e.g. the surface of the posts) that may result in unwanted light scattering.

In the micromirror device as discussed above with reference to FIGS. 1 and 2, the deflectable reflective mirror plate is formed on a light transmissive substrate (e.g. substrate 102 that is transmissive to visible light); and the addressing electrode is fabricated on another substrate (e.g. substrate 104) that is a semiconductor substrate. In another example, the deflectable reflective mirror plate can be fabricated on the same substrate, such as the semiconductor substrate on which standard integrated circuits can be fabricated.

The micromirror device can be fabricated as a member of a micromirror array device that comprises an array of micromirror devices. In this instance, the micromirror devices of the micromirror array device may or may not be the same. For example, a micromirror device in the micromirror array device may have only one, or even no post that directly is connected to the deformable hinge or a hinge support to which the deformable hinge is affixed for supporting the deformable hinge. Instead, the deformable hinges of a group of adjacent micromirror devices are interconnected such that, the deformable hinge of one micromirror having no post or less than two posts can be supported by the deformable hinges and posts of other micromirrors in the group, as set forth in U.S. patent application Ser. No. 10/969,251 and Ser. No. 10/969,503, both filed Oct. 19, 2004, the subject matter of each being incorporated herein by reference in its entirety.

The micromirror device having a structural layer that comprises a $TiN_x$ layer as discussed above can be fabricated in many ways. As an example, a fabrication process will be discussed in the following with reference to FIG. 5 to FIG. 7. It will be understood that the following discussion is for demonstration purposes only, and should not be interpreted as a limitation. Instead, any variations without departing from the spirit of the invention are applicable. For example, the micromirror Referring to FIG. 5, substrate 102 is provided. The substrate can be glass (e.g. Corning 1737F, Eagle 2000, quartz, Pyrex™, sapphire) that is transparent to visible light. First sacrificial layer 128 is deposited on substrate 102 followed by forming mirror plate 110. First sacrificial layer 128 may be any suitable material, such as amorphous silicon, or could alternatively be a polymer or polyimide, or even polysilicon, silicon nitride, silicon dioxide and tungsten, depending upon the choice of sacrificial materials, and the etchant selected. In an embodiment of the invention, the first sacrificial layer is amorphous silicon, and it is preferably deposited at 300-350° C. The thickness of the first sacrificial layer can be wide ranging depending upon the micromirror size and desired tilt angle of the micro-micromirror, though a thickness of from 500 Å to 50,000 Å, preferably close to 25,000 Å, is preferred. The first sacrificial layer may be deposited on the substrate using any suitable method, such as LPCVD or PECVD.

As an optional feature of the embodiment, an anti-reflection film and/or light transmissive electrode (e.g. electrode 106 in FIG. 1) maybe deposited on the surface of substrate 102. The anti-reflection film is deposited for reducing the reflection of the incident light from the surface of the substrate. Of course, other optical enhancing films may be deposited on either surface of the glass substrate as desired. In addition to the optical enhancing films, an electrode may be formed on a surface of substrate 102. The electrode can be formed as an electrode grid or a series of electrode segments (e.g. electrode strips) around the mirror plate.

Figure 5:
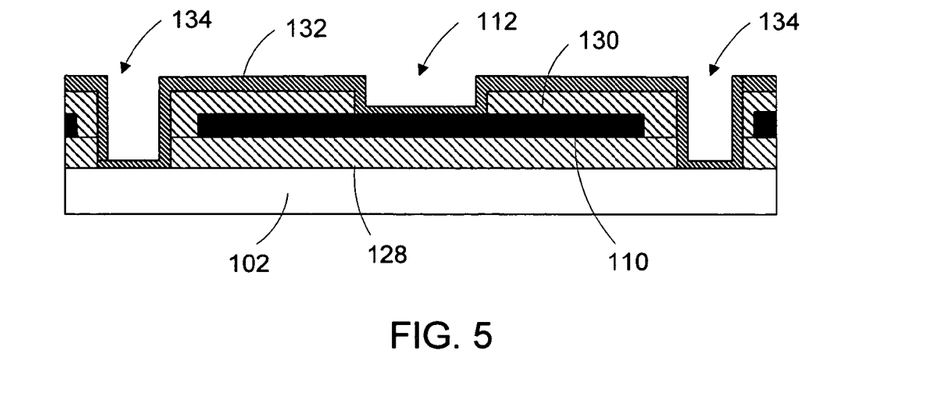
FIG. 5 to FIG. 7 demonstratively plot cross-sections of the micromirror in FIG. 2 during an exemplary fabrication process.

Mirror plate 110 is fabricated by depositing a mirror plate layer followed by patterning the mirror plate layer on the first sacrificial layer. The mirror plate layer can be deposited by PVD. When the mirror plate comprises a $TiN_x$ layer, the $TiN_x$ layer is deposited using a reactive sputtering technique with a low sputtering rate and low sputtering power. The ratio of the argon gas and nitrogen gas in the sputtering is preferably higher than 4:1, such as 5:1 or higher, 6:1 or higher, or 7:1 or higher. An exemplary recipe of reactive sputtering $TiN_x$ comprises: a sputtering temperature near 400° C., 700 watts sputtering power, 140 sccm flow rate of argon gas, and 20 sccm flow rate of nitrogen gas. The unit of "sccm" represents the "standard cubic centimeters per minute." Alternatively, the $TiN_x$ mirror plate layer can be deposited using a deposition recipe that comprises: a sputtering temperature near 400° C., 1000 watts sputtering power, 140 sccm of flow rate for argon gas, and 25 sccm flow rate for nitrogen gas.

After deposition, the deposited mirror plate layer is patterned into a desired shape, such as that in FIG. 2. The patterning of the mirror plate layers can be performed using a standard photoresist patterning followed by etching using, for example $CF_4$, $Cl_2$, or other suitable etchant depending upon the specific material of the micromirror plate layer.

During the etching process for patterning the mirror plate layers, a portion of the mirror plate layers may be etched that should not be. This problem can be solved by depositing a protection layer on the mirror plate. The protection layer has a resistant to etch higher than that of the structural layers, but is removable afterwards, for example, during the etching process for the sacrificial layers.

After forming the mirror plate, second sacrificial layer 130 is deposited on the mirror plate and first sacrificial layer. The second sacrificial layer may comprise amorphous silicon, or could alternatively comprise one or more of the various materials mentioned above in reference to the first sacrificial layer. First and second sacrificial layers need not be the same, although they are the same in the preferred embodiment so that, in the future, the etching process for removing these sacrificial materials can be simplified. Similar to the first sacrificial layer, the second sacrificial layer may be deposited using any suitable method, such as LPCVD or PECVD. In the embodiment of the invention, the second sacrificial layer comprises amorphous silicon deposited at approximate 350° C. The thickness of the second sacrificial layer can be on the order of 12,000 Å, but may be adjusted to any reasonable thickness, such as between 2,000 Å and 20,000 Å depending upon the desired distance (in the direction perpendicular to the micromirror plate and the substrate) between the micromirror plate and the hinge. It is preferred that the hinge and mirror plate be separated by a gap with a size from 0.1 to 1.5 microns, more preferably from 0.1 to 0.45 micron, and more preferably from 0.25 to 0.45 microns. Larger gaps could also be used, such as a gap from 0.5 to 1.5 micrometers, or from 0.5 to 0.8 micrometer, or from 0.8 to 1.25 micrometers, or from 1.25 to 1.5 micrometers.

In the preferred embodiment of the invention, the micromirror plate comprises aluminum, and the sacrificial layers (e.g. the first and second sacrificial layer) are amorphous silicon. This design, however, can cause defects due to the diffusion of the aluminum and silicon, especially around the edge of the mirror plate. To solve this problem, a protection layer (not shown) maybe deposited on the patterned micromirror plate before depositing the second sacrificial silicon layer such that the aluminum layer can be isolated from the silicon sacrificial layer. This protection may or may not be removed after removing the sacrificial materials. If the protection layer is not to be removed, it is patterned after deposition on the mirror plate.

The second sacrificial layer is then patterned for forming two deep-via 134 and shallow via 112 using a standard lithography technique followed by etching, as shown in the figure. The etching step may be performed using $Cl_2$, $BCl_3$, or other suitable etchant depending upon the specific material(s) of the second sacrificial layer. The distance across the two deep-via areas depends upon the length of the defined diagonal of the micromirror plate. In an embodiment of the invention, the distance across the two deep-via areas after the patterning is preferably around 10 μm, but can be any suitable distance as desired. In order to form the shallow-via area, an etching step using $CF_4$ or other suitable etchant may be executed. The shallow-via area, which can be of any suitable size, is preferably on the order of 2.2 square microns. And the size of each deep-via is approximate 1.0 micron.

After patterning the second sacrificial layer, hinge structure layer 132 is deposited on the second sacrificial layer. Because the hinge structure is designated for holding the deformable hinge and the micromirror plate, it is desired that the hinge structure layer comprises of materials having at least large elastic modulus. According to an embodiment of the invention, the hinge structure layer comprises a 400 Å thickness of $TiN_x$ (although it may comprise $TiN_x$, and may have a thickness between 100 Å and 2000 Å) layer deposited by PVD, and a 3500 Å thickness of $SiN_x$ (although the thickness of the $SiN_x$ layer may be between 2000 Å and 10,000 Å) layer 350 deposited by PECVD. Of course, other suitable materials and methods of deposition may be used (e.g. methods, such as LPCVD or sputtering). The $TiN_x$ layer may or may not be deposited using the same method as the $TiN_x$ mirror plate layer as discussed above. However, it is preferred that the $TiN_x$ layer is deposited using a reactive sputtering technique with a low sputtering rate and low sputtering power. The ratio of the argon gas and nitrogen gas in the sputtering is preferably higher than 4:1, such as 5:1 or higher, 6:1 or higher, or 7:1 or higher. An exemplary recipe of reactive sputtering $TiN_x$ comprises: a sputtering temperature near 400° C., 700 watts sputtering power, 140 sccm flow rate of argon gas, and 20 sccm flow rate of nitrogen gas. The unit of "sccm" represents the "standard cubic centimeters per minute." Alternatively, the $TiN_x$ mirror plate layer can be deposited using a deposition recipe that comprises: a sputtering temperature near 400° C., 1000 watts sputtering power, 140 sccm of flow rate for argon gas, and 25 sccm flow rate for the nitrogen gas.

After the deposition, hinge structure layer 132 is patterned into a desired configuration, such as hinge support 120 in FIG. 2. An etching step using one or more proper etchants is executed in patterning the hinge structure layer. In particular, the layer can be etched with a chlorine chemistry or a fluorine chemistry where the etchant is a perfluorocarbon or hydro fluorocarbon (or $SF_6$) that is energized so as to selectively etch the hinge support layers both chemically and physically (e.g. a plasma/RIE etch with $CF_4$, $CHF_3$, $C_3F_8$, $CH_2F_2$, $C_2F_6$, $SF_6$, etc. or more likely combinations of the above or with additional gases, such as $CF_4/H_2$, $SF_6/Cl_2$, or gases using more than one etching species such as $CF_2Cl_2$, all possibly with one or more optional inert diluents). Different etchants may, of course, be employed for etching each hinge support layer (e.g. chlorine chemistry for a metal layer, hydrocarbon or fluorocarbon (or $SF_6$) plasma for silicon or silicon compound layers, etc.).

Figure 6:
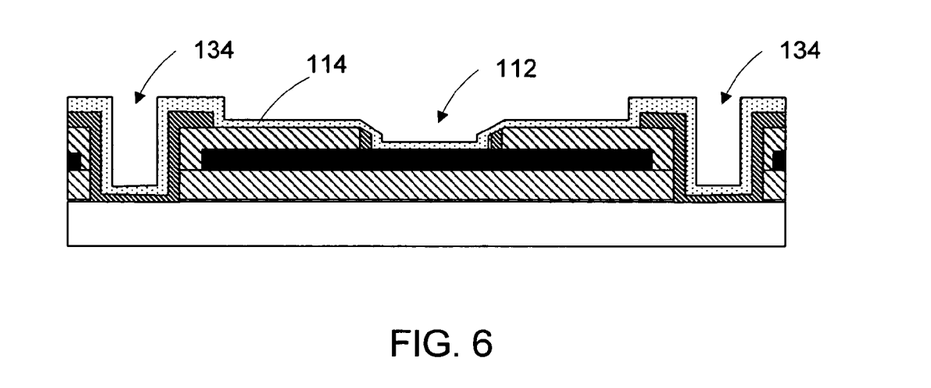

Referring to FIG. 6, after patterning the hinge structure layer, the bottom segment of contact area 112 is removed and part of the micromirror plate underneath the contact area is thus exposed. Hinge layer 114 for the deformable hinge is then deposited. In particular, the hinge layer fills the exposed area at the bottom of 112 so as to form an electric-contact between the deformable hinge and mirror plate. The sidewalls of the contact are left with residues of the hinge structure layers after patterning. The residue on the sidewalls helps to enhance the mechanical and electrical properties of the hinge. Each of the two deep-via 134 on either side of the mirror can form a continuous element with the deep-via areas corresponding to the adjacent micromirror in an array.

In the embodiment of the invention, the hinge layer is a multilayered structure that comprises a $TiN_x$ layer that is laminated between two $SiN_x$ layers. The $TiN_x$ layer has a thickness from 10 Å to 200 Å, and preferably from 20 Å to 80 Å, and more preferably around 50 Å. Each of the two $SiN_x$ layers has a thickness around 400 Å. The $SiN_x$ layers can be deposited using any suitable PVD deposition techniques. The $TiN_x$ layer is deposited using a reactive sputtering technique as discussed above in depositing the $TiN_x$ layers of the hinge structural layer and the mirror plate layer, which will not be repeated herein.

After deposition, the hinge layer is then patterned as desired using etching. Similar to the hinge structure layer, the hinge layer can be etched with a chlorine chemistry or a fluorine chemistry where the etchant is a perfluorocarbon or hydro fluorocarbon (or $SF_6$) that is energized so as to selectively etch the hinge layers both chemically and physically (e.g. a plasma/RIE etch with $CF_4$, $CHF_3$, $C_3F_8$, $CH_2F_2$, $C_2F_6$, $SF_6$, etc. or more likely combinations of the above or with additional gases, such as $CF_4/H_2$, $SF_6/Cl_2$, or gases using more than one etching species such as $CF_2Cl_2$, all possibly with one or more optional inert diluents). Different etchants may, of course, be employed for etching each hinge layer (e.g. chlorine chemistry for a metal layer, hydrocarbon or fluorocarbon (or $SF_6$) plasma for silicon or silicon compound layers.).

In patterning the hinge layers using etch, a portion of the hinge layers may be eroded during etch, which should not be. For this reason, a protection layer may be deposited on the hinge layer, as that for protecting the mirror plate layer.

Figure 7:
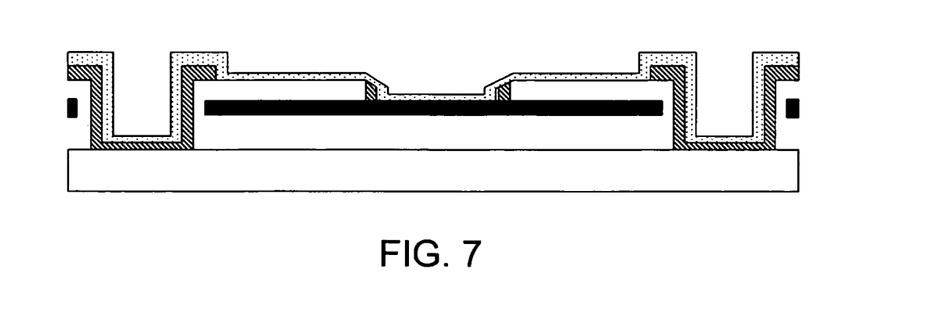

After the hinge is formed, the micromirror is released by removing the sacrificial materials of the first and second sacrificial layers, a cross-sectional view of which is presented in FIG. 7.

In order to efficiently remove the sacrificial material (e.g. amorphous silicon), the release etching utilizes an etchant gas capable of spontaneous chemical etching of the sacrificial material, preferably isotropic etching that chemically (and not physically) removes the sacrificial material. Such chemical etching and apparatus for performing such chemical etching are disclosed in U.S. patent application Ser. No. 09/427,841 to Patel et al. filed Oct. 26, 1999, and in U.S. patent application Ser. No. 09/649,569 to Patel et al. filed Aug. 28, 2000, the subject matter of each being incorporated herein by reference. Preferred etchants for the release etch are gas phase fluoride etchants that, except for the optional application of temperature, are not energized. Examples include HF gas, noble gas halides such as xenon difluoride, and interhalogens such as $IF_5$, $BrCl_3$, $BrF_3$, $IF_7$ and $ClF_3$. The release etch may comprise inert gas components such as ($N_2$, Ar, Xe, He, etc.). In this way, the remaining sacrificial material is removed and the micromechanical structure is released. In one aspect of such an embodiment, $XeF_2$ is provided in an etching chamber with diluents (e.g. $N_2$ and He). The partial pressure of $XeF_2$ is preferably 8 Torr, although the concentration can be varied from 1 Torr to 30 Torr or higher. This non-plasma etch is employed for preferably 900 seconds, although the time can vary from 60 to 5000 seconds, depending on temperature, etchant concentration, pressure, quantity of sacrificial material to be removed, or other factors. The etch rate may be held constant at, for example, 18 Å/s/Torr, although the etch rate may vary from 1 Å/s/Torr to 100 ÅA/s/Torr. Each step of the release process can be performed at room temperature.

In addition to the above etchants and etching methods mentioned for use in either the final release or in an intermediate etching step, there are others that may also be used by themselves or in combination. Some of these include wet etches, such as ACT, KOH, TMAH, HF (liquid); oxygen plasma, $SCCO_2$, or super critical $CO_2$ (the use of super critical $CO_2$ as an etchant is described in U.S. patent application Ser. No. 10/167,272, which is incorporated herein by reference). However, spontaneous vapor phase chemical etchants are more preferred, because the sacrificial material, such as amorphous silicon within small spaces, and small gaps can be more efficiently removed via gaps between adjacent mirror plates and the lateral gap as compared to other sacrificial materials (e.g. organic materials) and other etching methods. Though not required in all embodiments of the present invention, a micromirror array with a small gap, a small pitch and a small distance between the hinge and the mirror plate can thus be more easily fabricated with such spontaneous vapor phase chemical etchants, as set forth in U.S. patent application Ser. No. 10/627,155 filed Jul. 24, 2003, Ser. No. 10/666,671 filed Sep. 17, 2003, and Ser. No. 10/666,002 filed Sep. 17, 2003, the subject matter of each being incorporated herein by reference.

The released micromirror, such as that in FIG. 7, can then be assembled with a semiconductor substrate (e.g. substrate 104 in FIG. 1) having formed therein an addressing electrode by bonding the semiconductor substrate and light transmissive substrate together. The bonding can use a standard bonding agent, such as epoxy. Alternatively, an electrically conductive bonding agent can be used for extending the electrical contact of the mirror plate, hinge, and light transparent electrode (e.g. electrode 106 in FIG. 1) to the semiconductor substrate. In practice, the micromirror devices and the micromirror array devices are often manufactured on a wafer level. Specifically, a plurality of micromirror dies is formed on a light transmissive wafer with each micromirror die comprising an array of micromirrors. The wafer having the micromirror die can then be assembled to a semiconductor wafer having a plurality of electrode dies each of which comprises an array of addressing electrodes. The assembled micromirror devices each comprising a micromirror die and an electrode die on the assembled semiconductor wafer and light transmissive wafer are then separated so as to form individual micromirror devices. Alternatively, the micromirror dies and electrode dies can be respectively separated before assembling the micromirror dies and the electrode dies. The singulated micromirror array devices may be packaged after quality inspection.

Figure 8:
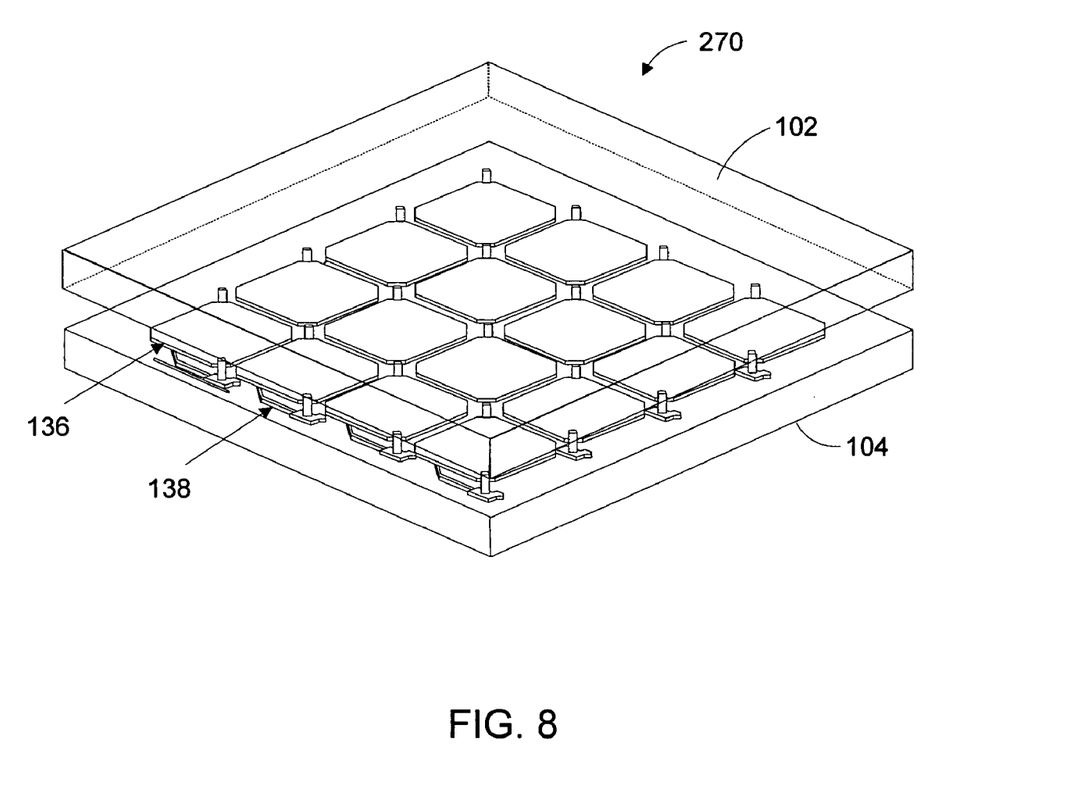
FIG. 8 is a perspective view of a micromirror array device having an array of reflective and deflectable micromirrors of FIG. 2.

FIG. 8 demonstratively illustrates a micromirror array device. For simplicity purposes, only 16 (sixteen) are illustrated. When used as a spatial light modulator, the micromirror array device generally comprises an array of thousands or millions of micromirrors, the total number of which determines the resolution of the displayed images. For example, the micromirror array of the spatial light modulator may have 1024×768 or greater, 1280×720 or greater, 1400×1050 or greater, 1600×1200 or greater, 1920×1080 or greater, or even larger number of micromirrors. In other applications, the micromirror array may have less number of micromirrors. As shown in the figure, micromirror array device 270 comprises light transmissive substrate 102, on which micromirror array 136 is formed. An array of addressing electrodes 138 on semiconductor substrate 104 is disposed proximate to the micromirrors for electrostatically deflecting the micromirrors.

Figure 9:
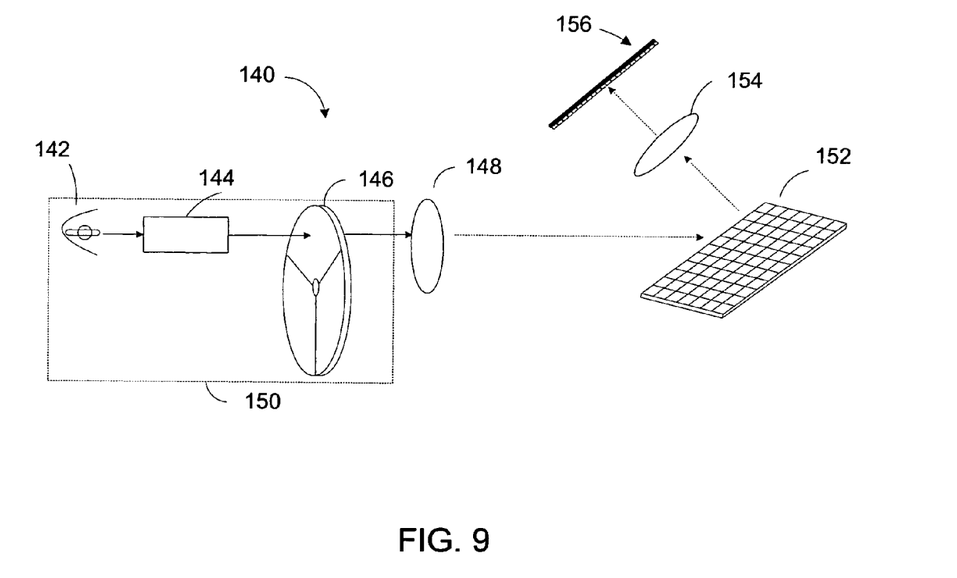
FIG. 9 schematically illustrates an display system employing a micromirror array device of FIG. 8.

FIG. 9 schematically illustrates an exemplary display system that empls a spatial light modulator that comprises an array of micromirrors of the invention. In this particular example, display system 140 comprises light source illumination system 150, group lens 148, spatial light modulator 152, projection lens 154, and display target 156. The illumination system may further comprise light source 142, light pipe 144, and color filter 146 such as a color wheel. Alternative to the illumination system as shown in the figure wherein the color wheel is positioned after the light pipe along the propagation path of the illumination light from the light source, the color wheel can also be positioned between the light source and light pipe at the propagation path of the illumination light. The illumination light can be polarized or non-polarized. When polarized illumination light is used, display target 156 may comprise a polarization filter associated with the polarized illumination light, as set forth in U.S. provisional patent application Ser. No. 60/577,422 filed Jun. 4, 2004, the subject matter being incorporated herein by reference.

The lightpipe can be a standard lightpipe that are widely used in digital display systems for delivering homogenized light from the light source to spatial light modulators. Alternatively, the lightpipe can be the one with movable reflective surfaces, as set forth in U.S. patent provisional application Ser. No. 60/620,395 filed Oct. 19, 2004, the subject matter being incorporated herein by reference.

The color wheel comprises a set of color and/or white segments, such as red, green, blue, or yellow, cyan, and magenta. The color wheel may further comprise a clear or non-clear segment, such as a white segment or high throughput for achieving particular purposes, as in the color wheel prior art or as set forth in U.S. patent application Ser. No. 10/899,637, and Ser. No. 10/899,635 both filed Jul. 26, 2004, the subject matter of each being incorporated herein by reference, which will not be discussed in detail herein.

Figure 10:
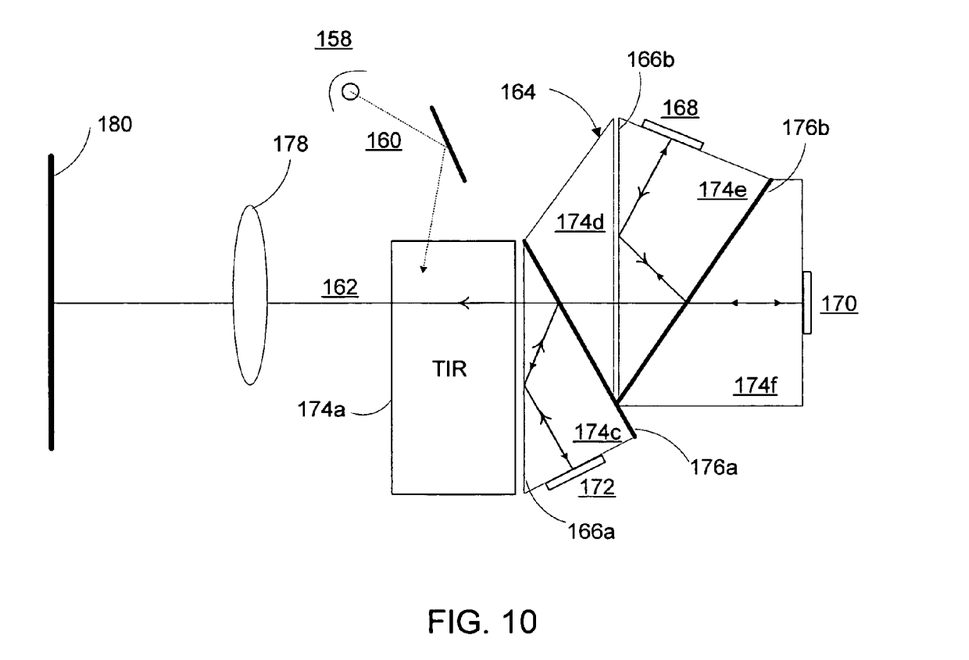
FIG. 10 schematically illustrates another display system employing a plurality of micromirror array devices of FIG. 8.

The display system in FIG. 9 empls one spatial light modulator. However, a display system may use multiple spatial light modulators for modulating the illumination light of different colors. One of such display systems is schematically illustrated in FIG. 10. Referring to FIG. 10, the display system uses a dichroic prism assembly 164 for splitting incident light into three primary color light beams. Dichroic prism assembly comprises TIR 174a, 174c, 174d, 174e and 174f. Totally-internally-reflection (TIR) surfaces, i.e. TIR surfaces 166a and 166b, are defined at the prism surfaces that face air gaps. The surfaces 176a and 176b of prisms 174c and 174e are coated with dichroic films, yielding dichroic surfaces. In particular, dichroic surface 176a reflects green light and transmits other light. Dichroic surface 176b reflects red light and transmits other light. The three spatial light modulators, 168, 170 and 172, each having a micromirror array device, are arranged around the prism assembly.

In operation, incident white light 160 from light source 158 enters into TIR 174a and is directed towards spatial light modulator 170, which is designated for modulating the blue light component of the incident white light. At the dichroic surface 176a, the green light component of the totally internally reflected light from TIR surface 166a is separated therefrom and reflected towards spatial light modulator 172, which is designated for modulating green light. As seen, the separated green light may experience TIR by TIR surface 166b in order to illuminate spatial light modulator 172 at a desired angle. This can be accomplished by arranging the incident angle of the separated green light onto TIR surface 166b larger than the critical TIR angle of TIR surface 166b. The rest of the light components, other than the green light, of the reflected light from the TIR surface 166a pass through dichroic surface 176a and are reflected at dichroic surface 176b. Because dichroic surface 176b is designated for reflecting red light component, the red light component of the incident light onto dichroic surface 176b is thus separated and reflected onto spatial light modulator 168, which is designated for modulating red light. Finally, the blue component of the white incident light (white light 160) reaches spatial light modulator 170 and is modulated thereby. By coordinating operations of the three spatial light modulators, red, green, and blue lights can be properly modulated. The modulated red, green, and blue lights are recollected and delivered onto display target 180 through optic elements, such as projection lens 178, if necessary.

The light source, such as light source 142 in FIGS. 9 and 158 in FIG. 10, of the display system can be any suitable light source, such as an arc lamp, preferably an arc lamp with a short arc for providing intense illumination light. The light source can also be an arc lamp with a spiral or other reflector, such as set forth in U.S. patent application Ser. No. 11/055,654 filed Feb. 9, 2005, the subject matter being incorporated herein by reference.

Alternatively, the light source can be one or more light-emitting-diodes (LEDs), preferably LEDs of high intensities, due to their compact sizes, low costs, and capabilities of emitting different colors including white. The display system may employ one LED as the light source, in which instance, a LED emitting white color can be used. Alternatively, the display system may use different LEDs for generating red, green, and blue colors for illuminating the spatial light modulator. As an example, gallium nitride light emitting diodes could be used for the green and blue arrays and gallium arsenide (aluminum gallium arsenide) could be used for the red light emitting diode array. LEDs such as available or disclosed by Nichia™ or Lumileds™ could be used, or any other suitable light emitting diodes. When LEDs emitting different colors are used as the light source, the color wheel (e.g. color wheel 106 in FIG. 1A) may be omitted.

In yet another example, an array of LEDs emitting the same (or similar) color can be used for generating a color light for illuminating the spatial light modulator. For example, an array of LEDs emitting white color can be used as the light source for providing intensive illumination light. In some instances, the LEDs can be used along with an arc lamp as the light source for the system. Also, separate groups of LEDs (e.g. red, green and blue) can be provided, or a mixed array of different color LEDs (e.g. red, green and blue) could also be used.

It will be appreciated by those skilled in the art that a new and useful micromirror array device having a structural layer composed of $TiN_x$ have been described herein. In view of the many possible embodiments to which the principles of this invention may be applied, however, it should be recognized that the embodiments described herein with respect to the drawing figures are meant to be illustrative only and should not be taken as limiting the scope of invention. For example, those of skill in the art will recognize that the illustrated embodiments can be modified in arrangement and detail without departing from the spirit of the invention. For example, the $TiN_x$ material and the method of making the same according to the invention are also applicable to any devices or structures when $TiN_x$ materials are applicable.

I claim:

1. A microelectromechanical device comprising a deflectable reflective mirror plate, wherein the deflectable reflective mirror plate comprises $TiN_x$, wherein the $TiN_x$ has a compressive stress that is greater than −800 MPa with a thickness of 500 angstroms or less.

2. The device of claim 1, wherein the thickness of the $TiN_x$ is 200 angstroms or less.

3. The device of claim 1, wherein the thickness of the $TiN_x$ is from 40 to 500 angstroms.

4. The device of claim 1, wherein the compressive stress is −200 MPa or greater.

5. The device of claim 4, wherein the thickness of the $TiN_x$ is 200 angstroms or less.

6. The device of claim 4, wherein the thickness of the $TiN_x$ is 150 angstroms or less.

7. The device of claim 1, wherein the microelectromechanical device is a micromirror device, and wherein the $TiN_x$ is a layer of the deflectable reflective mirror plate of the micromirror device.

8. The device of claim 7, wherein the mirror plate further comprises an electrically insulating layer.

9. The device of claim 8, wherein the electrically insulating layer comprises $SiO_x$.

10. The device of claim 1, wherein the microelectromechanical device is a micromirror device comprising a deformable hinge attached to the mirror plate, and wherein the deformable hinge comprises a $TiN_x$ layer.

11. The device of claim 10, wherein the deformable hinge further comprises an insulating layer.

12. The device of claim 11, wherein the insulating layer comprises $SiN_x$.

13. The device of claim 10, wherein the $TiN_x$ layer is laminated between two insulating layers.

14. The device of claim 13, wherein one of the two insulating layers comprises $SiN_x$.

15. The device of claim 11, wherein the $TiN_x$ layer has a thickness of 500 angstroms or less.

16. The device of claim 11, wherein the deformable hinge is attached to a light transmissive substrate.

17. The device of claim 11, wherein the deformable hinge is attached to a semiconductor substrate.

18. The device of claim 1, wherein the stoichiometric ratio of titanium to nitrogen is from 0.9 to 1.3.

19. The device of claim 1, wherein the stoichiometric ratio of titanium to nitrogen is less than 1.

20. The device of claim 1, wherein the $TiN_x$ is formed with DC magnetron sputtering in the absence of RF power.

21. The device of claim 1, wherein the $TiN_x$ has no oxygen.

22. The device of claim 1, wherein the $TiN_x$ comprises oxygen in an amount of greater than 0 (zero) but less than 15%.

23. A micro electromechanical device, comprising: an element that comprises a $TiN_x$ having a compressive stress σ and a thickness t, wherein the stress σ is expressed as:

$$\sigma \geq \sigma_o + \frac{M}{t - t_o}$$

wherein $\sigma_o$ is a constant that is 250 MPa or less; M is a constant that is $-1.6 \times 10^6$ MPaÅ or greater; and $t_o$ is a constant that is 380 or less.

24. The device of claim 23, wherein oxygen is absent from the $TiN_x$ material.

25. The device of claim 23, wherein the $TiN_x$ material comprises oxygen in an amount of greater than 0 (zero) but less than 15%.

26. The device of claim 23, wherein M is $-9.43 \times 10^5$ MPaÅ or greater.

27. The device of claim 23, wherein M is $-6.6 \times 10^5$ MPaÅ or greater.

28. The device of claim 23, wherein M is $-2.83 \times 10^5$ MPaÅ or greater.

29. The device of claim 23, wherein M is $-4.87 \times 10^4$ MPaÅ or greater.

30. The device of claim 23, wherein $t_o$ is 260 or less.

31. The device of claim 23, wherein $t_o$ is 190 or less.

32. The device of claim 23, wherein $t_o$ is 100 or less.

33. The device of claim 23, wherein $t_o$ is substantially 0 (zero).

34. The device of claim 23, wherein the stoichiometric ratio of titanium to nitrogen is from 0.87 to 1.3.

35. The device of claim 23, wherein the stoichiometric ratio of titanium to nitrogen is from 0.94 to 1.28.

36. The device of claim 23, wherein the stoichiometric ratio of titanium to nitrogen is less than 1.

37. The device of claim 23, wherein the $TiN_x$ is formed with DC magnetron sputtering in the absence of RF power.

38. The device of claim 23, wherein the microelectromechanical device is a micromirror device; wherein the $TiN_x$ is a layer of a deformable hinge of the micromirror device that comprises a reflective deflectable mirror plate; and wherein the mirror plate is attached to the deformable hinge such that the mirror plate is capable of being deflected relative to a substrate on which the micromirror device is formed.

39. The device of claim 38, wherein the mirror plate comprises a $TiN_x$ layer.

40. The device of claim 39, wherein the deformable hinge further comprises an electrically insulating layer.

41. The device of claim 40, wherein the electrically insulating layer comprises $SiO_x$.

42. The device of claim 40, wherein the mirror plate comprises a reflective layer comprising a reflective material that reflects 90% or more of an incident light beam.

43. The device of claim 42, wherein the reflective material is gold.

44. The device of claim 42, wherein the reflective material is silver.

45. The device of claim 42, wherein the reflective material is aluminum.

46. The device of claim 42, wherein the mirror plate further comprises an electrically insulating layer.

47. The device of claim 46, wherein the electrically insulating layer comprises $SiO_x$.

48. The device of claim 47, wherein the mirror plate further comprises another electrically conductive layer other than $TiN_x$.

49. The device of claim 48, wherein the electrically conductive layer comprises titanium.

50. The device of claim 38, wherein the substrate is transmissive to visible light.

51. The device of claim 50, wherein the mirror plate is associated with an addressing electrode on a semiconductor substrate.

52. The device of claim 51, wherein the semiconductor substrate and light transmissive substrate are bonded together.

53. The device of claim 52, wherein the micromirror is a member of an array of micromirrors; wherein the addressing electrode is a member of an array of addressing electrodes each of which being associated with one of the micromirrors of the micromirror array; and wherein the micromirror array and the associated addressing electrode array form a micromirror array device.

54. The device of claim 53, wherein each micromirror has one signal addressing electrode associated therewith.

55. The device of claim 38, wherein the substrate is a semiconductor substrate having formed thereon an addressing electrode.

56. A projection system, comprising:
an illumination system providing an illumination light beam;
a spatial light modulator comprising an array of micromirrors each of which comprises a deflectable reflective mirror plate comprising $TiN_x$, wherein the $TiN_x$ has a compressive stress that is greater than −800 MPa with a thickness of 500 angstroms or less for spatially modulating the illumination light beam so as to generate an image; and
a projection lens for projecting the modulated illumination light onto a display target.

57. The system of claim 56, wherein the illumination system comprises a light source, a lightpipe; and a color wheel.

58. The system of claim 57, wherein the lightpipe is positioned between the light source and the color wheel along a propagation path of the illumination light beam.

59. The system of claim 57, wherein the lightpipe is positioned after the light source and color wheel along a propagation path of the illumination light beam.

60. The system of claim 56, wherein the illumination system comprises a LED.

61. The system of claim 56, wherein oxygen is absent from the $TiN_x$.

62. The system of claim 56, wherein the $TiN_x$ comprises oxygen in an amount greater than 0 (zero) but less than 15%.

63. A projection system, comprising:
an illumination system providing an illumination light beam;
a spatial light modulator comprising an array of micromirrors, each of which comprises: a deformable hinge comprising $TiN_x$ having a compressive stress σ and a thickness t, wherein the stress σ is expressed as:

$$\sigma \geq \sigma_o + \frac{M}{t - t_o}$$

wherein $\sigma_o$ is a constant that is 250 MPa or less; M is a constant that is $-1.6 \times 10^6$ MPaÅ or greater; and $t_o$ is a constant that is 380 or less; and
a projection lens for projecting the modulated illumination light onto a display target.

64. The system of claim 63, wherein the illumination system comprises a light source, a lightpipe; and a color wheel.

65. The system of claim 63, wherein the lightpipe is positioned between the light source and the color wheel along a propagation path of the illumination light beam.

66. The system of claim 64, wherein the lightpipe is positioned after the light source and color wheel along a propagation path of the illumination light beam.

67. The system of claim 63, wherein the illumination system comprises a LED.

68. A microelectromechanical device a deformable hinge, wherein the deformable hinge comprises $TiN_x$, wherein the $TiN_x$ has a compressive stress that is greater than −800 MPa with a thickness of 500 angstroms or less.

69. The device of claim 68, wherein the thickness of the $TiN_x$ is 200 angstroms or less.

70. The device of claim 68, wherein the thickness of the $TiN_x$ is from 40 to 500 angstroms.

71. The device of claim 68, wherein the compressive stress is −200 MPa or greater.

72. The device of claim 71, wherein the thickness of the $TiN_x$ is 200 angstroms or less.

73. The device of claim 71, wherein the thickness of the $TiN_x$ is 150 angstroms or less.

74. The device of claim 68, wherein the microelectromechanical device is a micromirror device comprising a deflectable reflective mirror plate attached to the deformable hinge, and wherein the mirror plate comprises a $TiN_x$ layer.

75. The device of claim 74, wherein the mirror plate further comprises an electrically insulating layer.

76. The device of claim 75, wherein the electrically insulating layer comprises $SiO_x$.

77. The device of claim 74, wherein the $TiN_x$ layer has a thickness of 500 angstroms or less.

78. The device of claim 68, wherein the deformable hinge further comprises an insulating layer.

79. The device of claim 78, wherein the insulating layer comprises $SiN_x$.

80. The device of claim 68, wherein the $TiN_x$ is laminated between two insulating layers.

81. The device of claim 80, wherein one of the two insulating layers comprises $SiN_x$.

82. The device of claim 68, wherein the deformable hinge is attached to a light transmissive substrate.

83. The device of claim 68, wherein the deformable hinge is attached to a semiconductor substrate.

84. The device of claim 68, wherein the stoichiometric ratio of titanium to nitrogen is from 0.9 to 1.3.

85. The device of claim 68, wherein the stoichiometric ratio of titanium to nitrogen is less than 1.

86. The device of claim 68, wherein the $TiN_x$ is formed with DC magnetron sputtering in the absence of RF power.

87. The device of claim 68, wherein the $TiN_x$ has no oxygen.

88. The device of claim 68, wherein the $TiN_x$ comprises oxygen in an amount of greater than 0 (zero) but less than 15%.

89. A projection system, comprising:
an illumination system providing an illumination light beam;
a spatial light modulator comprising an array of micromirrors each of which comprises a deformable hinge comprising $TiN_x$, wherein the $TiN_x$ has a compressive stress that is greater than −800 MPa with a thickness of 500 angstroms or less for spatially modulating the illumination light beam so as to generate an image; and
a projection lens for projecting the modulated illumination light onto a display target.

90. The system of claim 89, wherein the illumination system comprises a light source, a lightpipe; and a color wheel.

91. The system of claim 90, wherein the lightpipe is positioned between the light source and the color wheel along a propagation path of the illumination light beam.

92. The system of claim 90, wherein the lightpipe is positioned after the light source and color wheel along a propagation path of the illumination light beam.

93. The system of claim 89, wherein the illumination system comprises a LED.

94. The system of claim 89, wherein oxygen is absent from the $TiN_x$.

95. The system of claim 89, wherein the $TiN_x$ comprises oxygen in an amount greater than 0 (zero) but less than 15%.

96. A projection system, comprising:
an illumination system providing an illumination light beam;
a spatial light modulator comprising an array of micromirrors, one of which comprises:

an element that comprises a TiN$_x$ having a compressive stress σ and a thickness t, wherein the stress σ is expressed as:

$$\sigma \geq \sigma_o + \frac{M}{t - t_o}$$

wherein $\sigma_0$ is a constant that is 250 MPa or less; M is a constant that is $-1.6 \times 10^6$ MPaÅ or greater; and $t_o$ is a constant that is 380 or less; and a projection lens for projecting the modulated illumination light onto a display target.

97. The system of claim 96, wherein the illumination system comprises a light source, a lightpipe; and a color wheel.

98. The system of claim 96, wherein the lightpipe is positioned between the light source and the color wheel along a propagation path of the illumination light beam.

99. The system of claim 97, wherein the lightpipe is positioned after the light source and color wheel along a propagation path of the illumination light beam.

100. The system of claim 96, wherein the illumination system comprises a LED.

* * * * *